(12) United States Patent
Endo et al.

(10) Patent No.: US 8,751,221 B2
(45) Date of Patent: Jun. 10, 2014

(54) COMMUNICATION APPARATUS FOR ADJUSTING A VOICE SIGNAL

(75) Inventors: Kaori Endo, Kawasaki (JP); Yasuji Ota, Kawasaki (JP); Takeshi Otani, Kawasaki (JP); Taro Togawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1079 days.

(21) Appl. No.: 12/408,812

(22) Filed: Mar. 23, 2009

(65) Prior Publication Data

US 2009/0248409 A1 Oct. 1, 2009

(30) Foreign Application Priority Data

Mar. 31, 2008 (JP) ................. 2008-093763

(51) Int. Cl.
*G10L 11/06* (2006.01)
(52) U.S. Cl.
USPC ......................................................... 704/208
(58) Field of Classification Search
USPC ......................................................... 704/208
See application file for complete search history.

(56) References Cited

U.S. PATENT DOCUMENTS

| 4,075,435 | A | * | 2/1978 | Eppler, Jr. ................. 369/47.41 |
| 5,432,859 | A | | 7/1995 | Yang et al. |
| 5,459,813 | A | | 10/1995 | Klayman |
| 5,652,828 | A | * | 7/1997 | Silverman ................. 704/260 |
| 2003/0177008 | A1 | * | 9/2003 | Chang ........................ 704/255 |
| 2004/0143433 | A1 | * | 7/2004 | Marumoto et al. ........... 704/225 |
| 2005/0015252 | A1 | | 1/2005 | Marumoto |
| 2005/0260985 | A1 | * | 11/2005 | Rader et al. ................ 455/432.3 |
| 2007/0003110 | A1 | * | 1/2007 | Gutta et al. .................. 382/115 |
| 2009/0111507 | A1 | * | 4/2009 | Chen .......................... 455/550.1 |

FOREIGN PATENT DOCUMENTS

| JP | 4-328798 | 11/1992 |
| JP | 2002-185572 | 6/2002 |
| JP | 2004-165865 | 6/2004 |

OTHER PUBLICATIONS

European Search Report dated Jul. 17, 2009, from the corresponding European Application.

* cited by examiner

*Primary Examiner* — Jakieda Jackson
(74) *Attorney, Agent, or Firm* — Katten Muchin Rosenman LLP

(57) ABSTRACT

A communication apparatus for adjusting a received voice signal in accordance with an ambient noise, the communication apparatus includes: a microphone for receiving an ambient noise and input voice and outputting a voice input signal corresponding to a level of the input voice and the ambient noise; a receiver for receiving the voice signal; a processer for extracting a voice component originated by a sender and an ambient noise component originated by the ambient noise, determining the ratio between the voice component and the ambient noise component, and adjusting the amplitude of the received voice signal in accordance with the ratio; and a speaker for outputting a reception voice corresponding to the adjusted reception voice signal.

10 Claims, 13 Drawing Sheets

COMMUNICATION APPARATUS FOR ADJUSTING A VOICE SIGNAL

CROSS-REFERENCE TO RELATED APPLICATION

This application is based upon and claims the benefit of priority of the prior Japanese Patent Application No. 2008-093763 filed on Mar. 31, 2008, the entire contents of which are incorporated herein by reference.

FIELD

A certain aspect of the embodiments discussed herein is related to a communication apparatus.

BACKGROUND

A cellular phone and an IP phone are often used in a place where ambient noise is large. Accordingly, it is necessary for the communication terminals to adjust a reception sound in consideration for a usage environment of the user (more to the point, ambient noise). As a technique for adjusting the reception sound, there are a technique for varying the sound amount of the reception sound (AGC: Auto Gain Control) and a technique for emphasizing a formant of the reception sound.

However, listenability of the reception sound depends on auditory property of the user. Consequently, it is not necessary the case that uniform variation of the sound volume of the reception sound in accordance with an ambient noise enables the user to hear well. That is, in a conventional communication terminal, it is impossible to adjust the reception sound only when the user feels that it is hard to hear.

Japanese Laid-open Patent Publication No. 04-328798, Japanese Laid-open Patent Publication No. 2002-185572, and Japanese Laid-open Patent Publication No. 2004-165865 disclose techniques for adjusting the reception sound in the communication apparatus.

SUMMARY

According to an aspect of an embodiment, a communication apparatus for adjusting a received voice signal in accordance with an ambient noise, the communication apparatus includes: a microphone for receiving an ambient noise and input voice and outputting a voice input signal corresponding to a level of the input voice and the ambient noise; a receiver for receiving the voice signal; a processer for extracting a voice component originated by a sender and an ambient noise component originated by the ambient noise, determining the ratio between the voice component and the ambient noise component, and adjusting the amplitude of the received voice signal in accordance with the ratio; and a speaker for outputting a reception voice corresponding to the adjusted reception voice signal.

The object and advantages of the invention will be realized and attained by means of the elements and combinations particularly pointed out in the claims.

It is to be understood that both the forgoing general description and the following detailed description are exemplary and explanatory and are not respective of the invention, as claimed.

DESCRIPTION OF EMBODIMENTS

First Embodiment

1. Outline of Voice Transmission System According to Embodiment

First, an outline of a voice transmission system 100 according to the embodiment will be described with reference to FIGS. 1 to 4. The voice transmission system 100 is a system that is mounted and provided in a communication terminal 1200 shown in FIG. 12.

There is, for example, a cellular phone as the communication terminal 1200. The cellular phone may be used at a place where ambient noise is loud, so that a reception sound is often deteriorated by the ambient noise. The cellular phone (communication terminal 1200) does not uniformly emphasize the reception sound when the reception sound is deteriorated, but adjusts the reception sound in accordance with the auditory property of the user. Specifically, the cellular phone emphasizes the reception sound when it is judged that a ratio of the ambient noise with respect to the reception sound is large and the user feels that it is difficult to hear due to the ambient noise, and outputs the reception sound without change when it is judged that the user does not feel that it is difficult to hear (transmission voice is hardly changed). Herewith, the user of the cellular phone can comfortably perform communication as compared with a conventional cellular phone.

Figure 1:
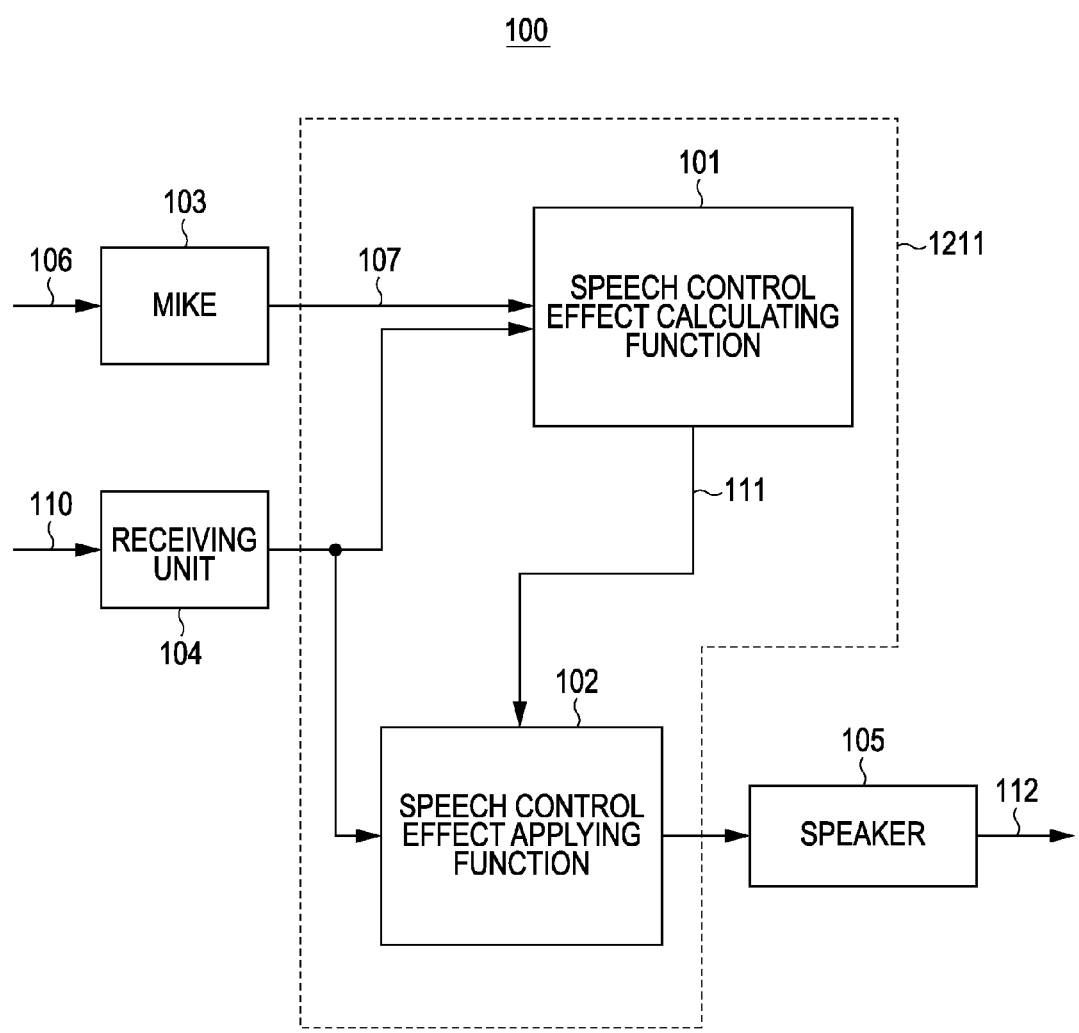
FIG. 1 is a block diagram showing an outline of a first voice transmission system according to an embodiment.

To be more specific, each function (a speech control effect calculating function 101, a speech control effect applying function 102) in the voice transmission system 100 performs a processing to be described below. FIG. 1 is a block diagram showing an outline of the voice transmission system 100 according to the embodiment. The voice transmission system 100 is equipped with the speech control effect calculating function 101, the speech control effect applying function 102, a microphone 103, a receiving unit 104, and a speaker 105. The speech control effect calculating function 101 calculates a variation amount 111 of a transmission voice that is varied due to a speech control effect, and the speech control effect applying function 102 adjusts a reception voice signal 110 by applying the variation amount 111. Herein, the speech control effect denotes a phenomenon in which a voice that is spoken by a person is varied in the case where the person who is speaking is difficult to hear a voice of the other party due to the ambient noise. Accordingly, in the embodiment, a function for calculating the variation amount of the transmission voice that is varied due to the ratio of the ambient noise with respect to the reception voice is referred to as the voice control effect calculating function 101.

First, the microphone 103 receives a sound 106. The microphone 103 outputs a sound signal 107 to the speech control effect calculating function 101. The sound signal 107 is an electrical signal corresponding to the sound signal 106. The sound signal 107 is constituted by an ambient noise 108 and a transmission voice signal 109. A reception voice signal 110 is received by the receiving unit 104. The sound signal 107 of the sound 106 received by the microphone 103 and the reception voice signal 110 received by the receiving unit 104 are input to the speech control effect calculating function 101, and the varied amount (variation amount) 111 of the transmission voice signal 109 that is varied due to the speech control effect is calculated by using the signals (step S401). The reception voice signal 110 received by the receiving unit 104 is input to the speech control effect applying function 102. The speech control effect applying function 102 applies the variation amount 111 to the reception voice signal 110 (step S402), and outputs a reception voice signal 112 that is adjusted by the speaker 105 (step S403).

As described above, the vice transmission system 100 applies the variation amount 111 of the transmission voice signal 109 that is varied due to the ambient noise 108 to the reception voice signal 110, so that the reception voice can be converted to a voice that is easy to hear for a user, and a reception sound that is easy to hear than a conventional transmission system can be created.

1.1. Communication Terminal 1200

Figure 12:
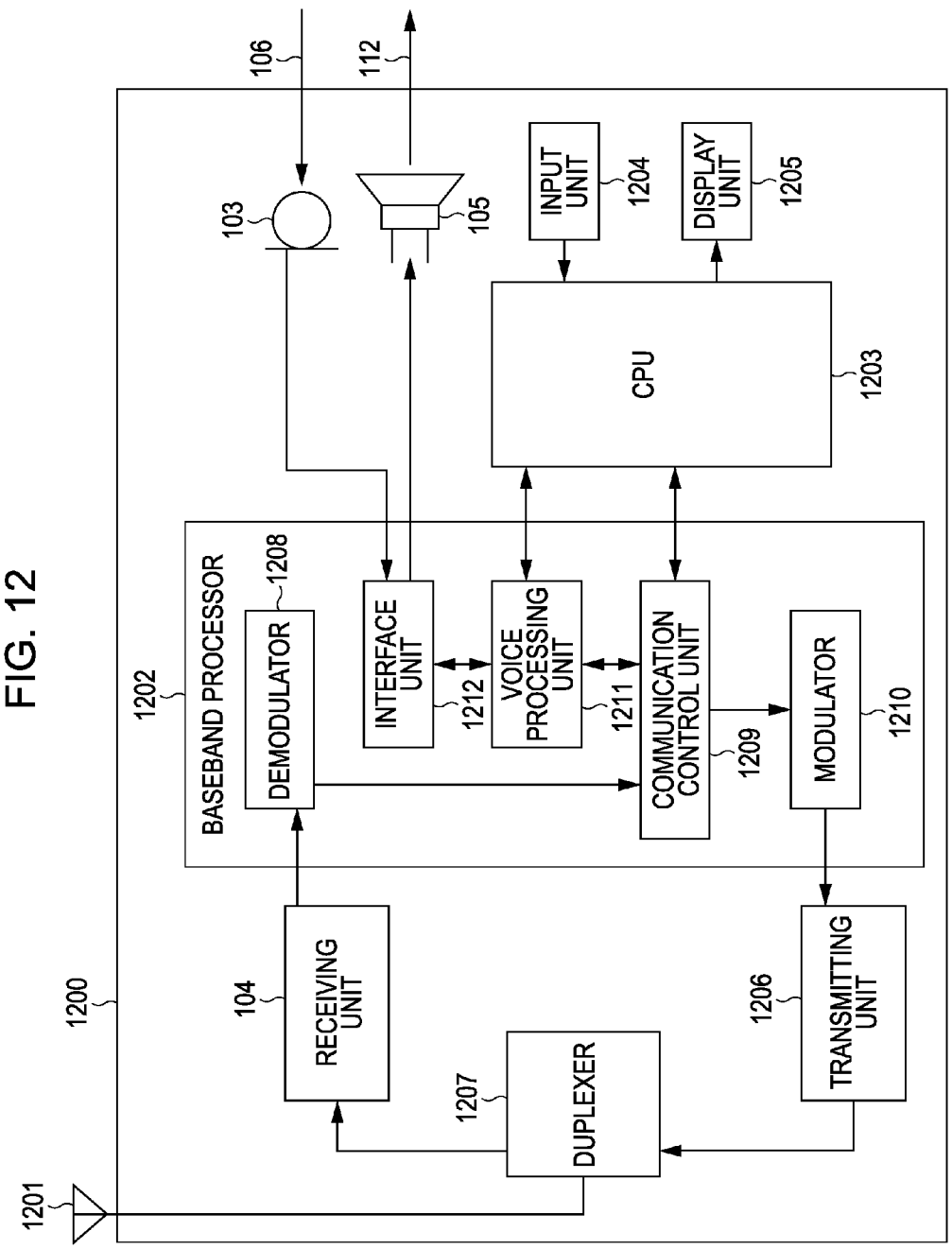
FIG. 12 is a hard block diagram showing a communication terminal according to the embodiment.

Next, a communication terminal 1200 in which the voice transmission system 100 is mounted will be described. FIG. 12 is a hard block diagram of the communication terminal 1200 according to the embodiment. The communication terminal 1200 includes a transmission/reception antenna 1201, a baseband processor 1202, a CPU 1203, an input unit 1204, a display unit 1205, the receiving unit 104, a transmitting unit 1206, a duplexer 1207, the microphone 103, and the speaker 105. The baseband processor 1202 includes a demodulator 1208, a communication control unit 1209, a modulator 1210, a voice processing unit 1211, and an interface unit 1212.

The communication terminal 1200 receives the reception voice signal 110 from another communication terminal via the transmission/reception antenna 1201. Further, the communication terminal 1200 transmits the transmission voice signal 109 to another communication terminal via the transmission/reception antenna 1201. Then the duplexer 1207 mounted in the communication terminal 1200 electrically separates a transmission pathway and a reception path way of the signals. The duplexer 1207 separates the reception voice signal 110 received by the transmission/reception antenna 1201 and transmission voice signal 109 transmitted by the transmission/reception antenna 1201.

The communication terminal 1200 receives the reception voice signal 110 by the receiving unit 104 via the transmission/reception antenna 1201. The receiving unit 104 transfers the reception voice signal 110 to the demodulator 1208 of the baseband processor 1202. The demodulator 1208 demodulates the reception voice signal 110 and transmits to the communication control unit 1209. The communication control unit 1209 decodes the demodulated reception voice signal 110. Then, the communication control unit 1209 transfers the decoded reception voice signal 110 to the vice processing unit 1211.

Figure 3:
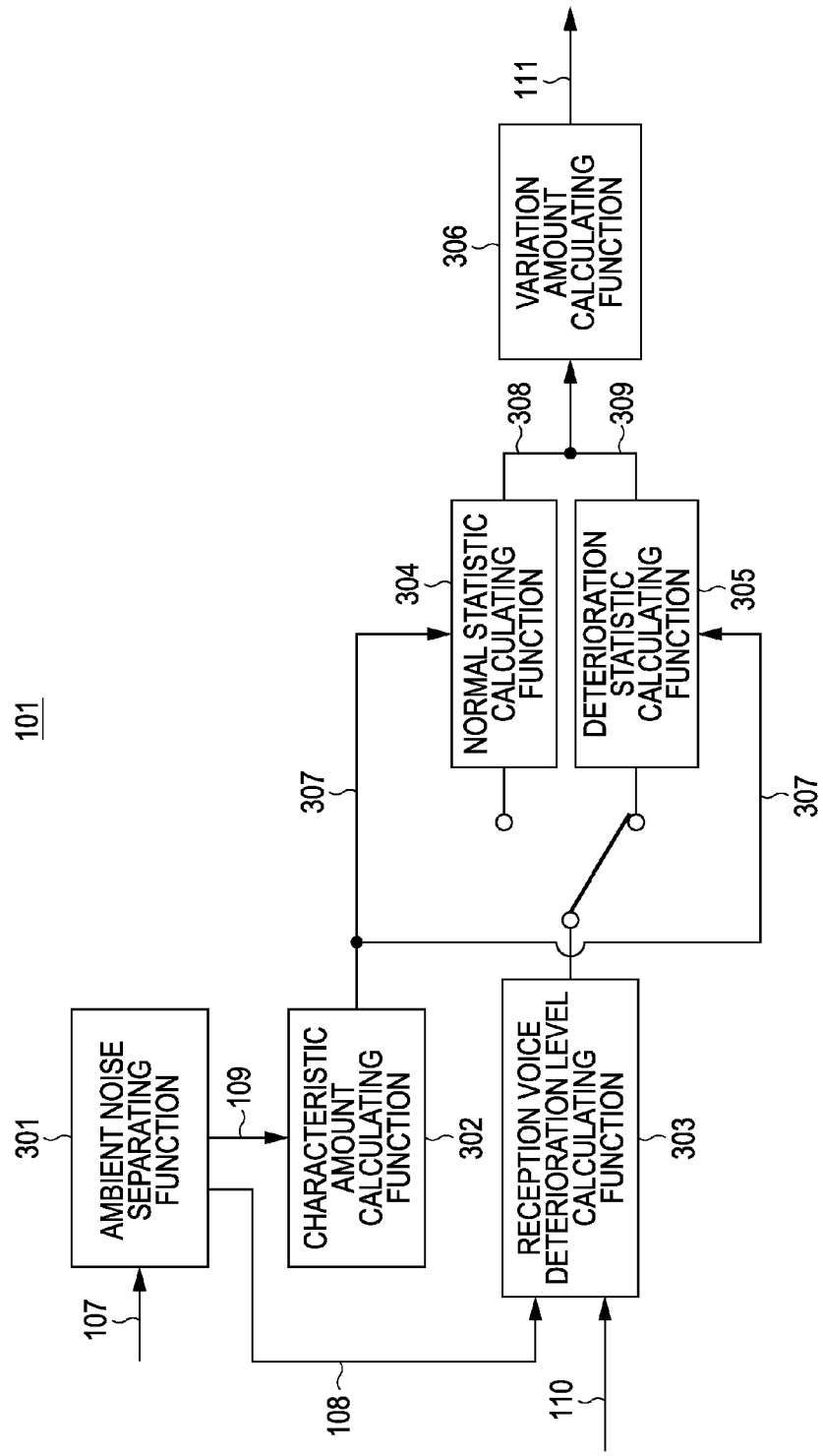
FIG. 3 is a block diagram showing a structure of a speech control effect calculating function according to the embodiment.
Figure 4:
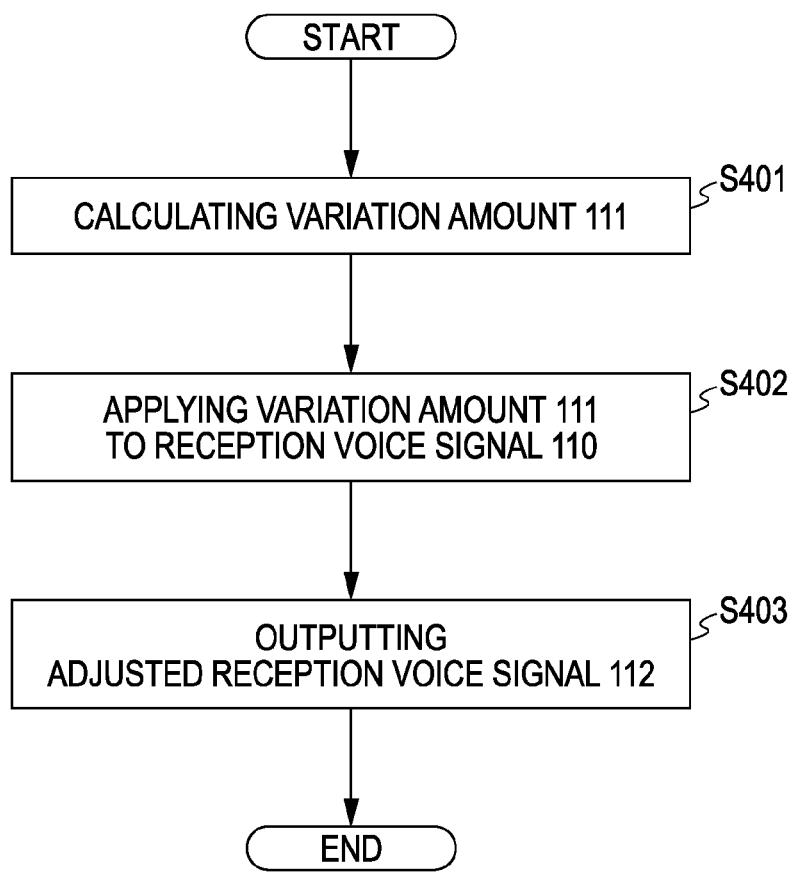
FIG. 4 is a flowchart showing a processing performed by the first voice transmission system.
Figure 13:
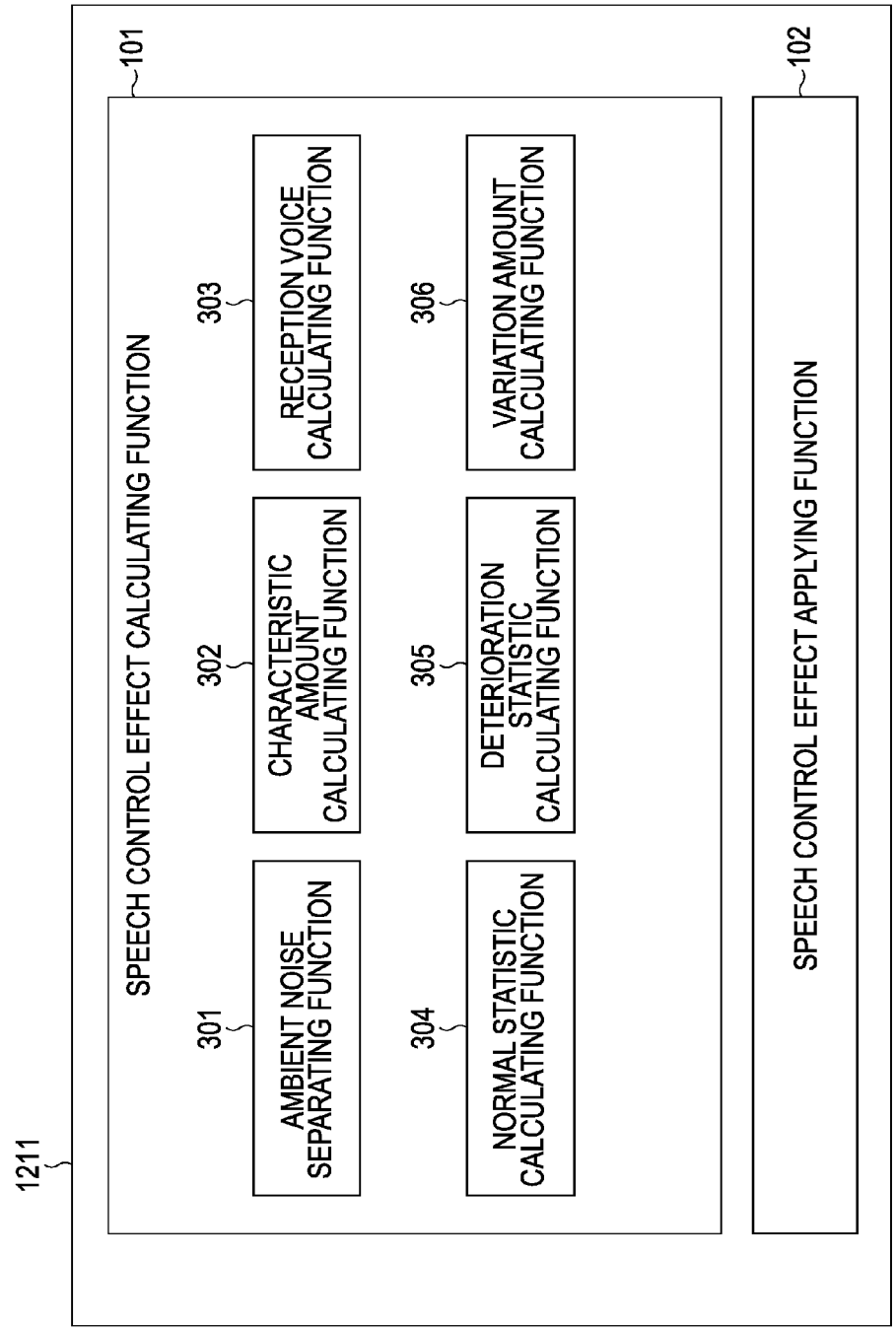
FIG. 13 is a functional block diagram showing a voice processing unit according to the embodiment.

The voice processing unit 1211 provides the processing of the speech control effect calculating function 101 and the processing of the speech control effect applying function 102. FIG. 13 is a functional block diagram of the voice processing unit 1211. The voice processing unit 1211 includes the speech control effect calculating function 101 and the speech control effect applying function 102. Then, the speech control effect calculating function 101 includes an ambient noise separating function 301, a characteristic amount calculating function 302, a reception voice calculating function 303, a normal statistic calculating function 304, a deterioration statistic calculating function 305, and a variation amount calculating function 306. The functions owned by the voice processing unit 1211 are cooperated to adjust the reception voice signal 110 as shown in FIGS. 1, 3. Schematically, the voice processing unit 1211 performs the following processing. First, the voice processing unit 1211 receives the voice signal 17 output by the microphone 13 via the interface unit 1212, and receives the reception voice signal 110 received by the receiving unit 104. Then, the voice processing unit 1211 performs the processing of the speech control effect calculating function 101 and the processing of the speech control effect applying function 102. The communication terminal 120 outputs the adjusted reception voice signal 112 from the speaker 105. The details of the processing of the speech control effect calculating function 101 and the processing of the speech control effect applying function 102 will be described below with reference to FIGS. 3, 6, and 7.

The CPU 1203 performs a control of a communication protocol and an execution control of an application mounted in the communication terminal 1200.

The input unit 104 is a unit with which a user of the communication terminal 1200 operates a key input. Further, the display unit 1205 is a display that displays an operation screen or a content of the communication terminal 1200.

2. Advantage of Communication Terminal 1200

The communication terminal 1200 according to the embodiment has an advantageous effect as compared with a conventional communication terminal. For example, a reception voice can be adjusted in accordance with the auditory property of the user as shown in the above description. The advantageous effect is provided by the function owned by the voice processing unit 1211. Accordingly, hereinafter, the structure of and the processing performed by the speech control effect calculating function 101 and the speech control effect applying function 102 will be described.

3. Speech Control Effect Calculating Function 101

Figure 6:
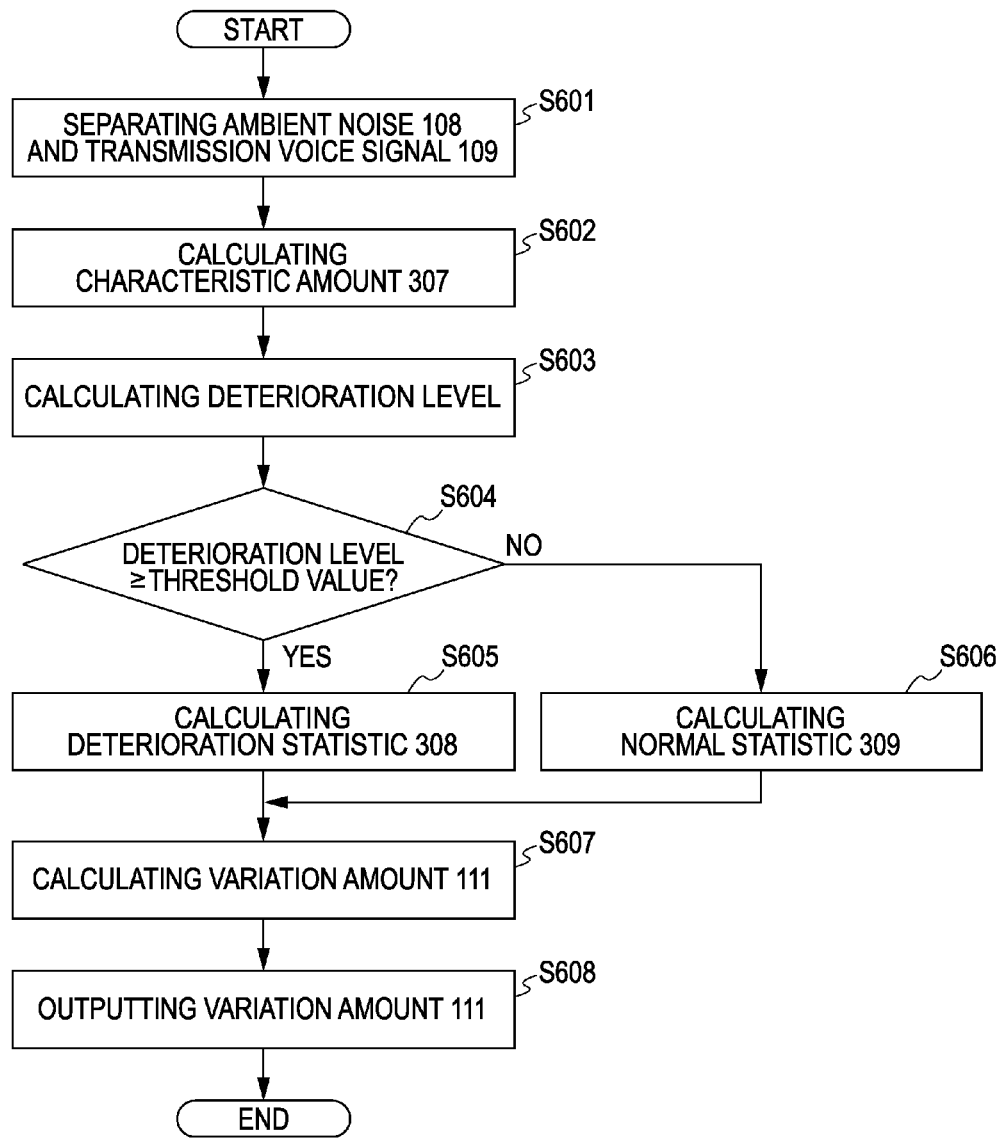
FIG. 6 is a flowchart showing a processing performed by the speech control effect calculating function according to the embodiment.

FIG. 3 is a functional block diagram showing a structure of the speech control effect calculating function 101 according to the embodiment. The speech control effect calculating function 101 is a function that is provided by the voice processing unit 1211 by a hardware, and a function constituting the speech control effect calculating function 101 is also a function that is provided by the voice processing unit 1211. The voice control effect calculating function 101 includes the ambient noise separating function 301, the characteristic amount calculating function 302, the reception voice deterioration level calculating function 303, the normal statistic calculating function 304, the deterioration statistic calculating function 305, and the variation amount calculating function 306. Further, FIG. 6 is a flowchart showing a processing that is performed by the speech control effect calculating function 101.

The sound signal 107 is input to the ambient noise separating function 301. The sound signal 17 is constituted by the ambient noise 108 and the transmission voice signal 109. The ambient noise separating function 301 separates the sound signal 107 into the ambient noise 108 and the transmission voice signal 109. In the embodiment, the ambient noise separating function 301 estimates SNR of the ambient noise 108 and the transmission voice signal 109. Then the ambient noise separating function 301 multiplies a power spectrum of the transmission voice signal 109 by a gain in accordance with the SNR to separate from the ambient noise 108 (step S601). To be more specific, the ambient noise separating function 301 performs time division on a frame of the sound signal 107 to be received. The ambient noise separating function 301 estimates the transmission voice signal 109 from the periodicity owned by the transmission voice signal 109. The ambient noise separating function 301 estimates the ambient noise 108 from the information of the time divided frame that does not include the transmission voice signal 109. Then, the ambient noise separating function 301 separates the received sound signal 107 into the ambient noise 108 and the transmission voice signal 109.

The transmission voice signal 109 is input to the characteristic amount calculating function 302, and a characteristic amount 307 of the input transmission voice signal 109 is calculated (step S602).

The ambient noise 108 and the reception voice signal 110 are input to the reception voice deterioration level calculating function 303. Then, the reception voice deterioration level calculating function 303 calculates a deterioration level (step S603). The deterioration level shows the level of the reception voice signal 110 that becomes hard to hear due to the influence of the ambient noise 108. The reception voice deterioration level calculating function 303 performs calculation so that the deterioration level of the reception voice signal 110 becomes larger as the SNR of the reception voice signal 110 and the ambient noise 108 becomes smaller. For example, the deterioration level=−SNR, SNR=power (dB) of the reception voice signal 110-power (dB) of the ambient noise 108. Further, the reception voice deterioration level calculating function 303 may perform time frequency conversion such as Fourier transform or the like on the reception voice signal 110 and the ambient noise 108 to perform calculation from the average value of the SNR that is calculated for every band. The reception voice deterioration level calculating function 303 performs any one of the normal statistic calculating function 304 and the deterioration statistic calculating function 305 in accordance with the deterioration level of the reception voice signal 110. In other words, the reception voice deterioration level calculating function 303 judges whether or not the ratio of the ambient noise 108 with respect to the reception voice signal 110 is not less than a predetermined threshold value. The reception voice deterioration level calculating function 303 performs any of the normal statistic calculating function 304 and the deterioration statistic calculating function 305 in accordance with the result of whether the ratio of the ambient noise 108 with respect to the reception voice signal 110 is not less than a predetermined threshold value or not. The reception voice deterioration level calculating function 303 judges that whether the deterioration level of the reception voice signal 110 is not less than the predetermined threshold value or not (S604). The threshold value shall be preliminarily provided.

When the reception voice deterioration level calculating function 303 judges that the deterioration level of the reception voice signal 110 is not less than the threshold value (step S604 YES), the deterioration statistical calculating function 305 is performed, and the characteristic amount 307 of the transmission voice signal 109 is input to the deterioration statistic calculating function 305 by the characteristic amount calculating function 302. Then the deterioration statistic calculating function 305 calculates the statistic of the characteristic amount 307 of the transmission voice signal 109 of the present frame (step S605). The deterioration statistic calculating function 305 newly adds the characteristic amount 307 of the present frame to the statistic that is calculated before the characteristic amount 307 of the transmission voice signal 109 of the present frame is received by the deterioration statistic calculating function 305, and calculates the average, dispersion, standard error of the average, and 95% reliable interval of the average value. When there is a plurality of types of the characteristic amount of the transmission voice signal 109, the deterioration statistic calculating function 305 performs the similar processing to each of them. The statistic that is calculated by the deterioration statistic calculating function 305 is a statistic of the characteristic amount 307 of the transmission voice signal 109 in the case where the reception voice signal 110 is deteriorated, and hereinafter referred to as a deterioration statistic 308. When the reception voice deterioration level calculating function 303 judges that the deterioration level of the reception voice signal 110 is less than the threshold value, (No in step S604), the normal statistic calculating function 304 is performed, and the characteristic amount 307 of the transmission voice signal 109 is input to the normal statistic calculating function 304 by the characteristic amount calculating function 302. Then the normal statistic calculating function 304 calculates the statistic of the characteristic amount 307 (step S606). The normal statistic calculating function 304 newly adds the characteristic amount 307 of the present frame to the statistic that is calculated before the characteristic amount 307 of the transmission voice signal 109 of the present frame is received by the normal statistic calculating function 304, and calculates the average, dispersion, standard error of the average, and 95% reliable interval of the average value. When there is a plurality of types of the characteristic amount of the transmission voice signal 109, the normal statistic calculating function 304 performs the similar processing to each of them. The statistic that is calculated by the normal statistic calculating function 304 is a statistic of the characteristic amount 307 of the transmission voice signal 109 in the case where it is judged that the reception voice signal 110 is not deteriorated, and hereinafter referred to as a normal statistic 309.

The variation amount calculating function 306 calculates the variation amount 111 of the characteristic amount 307 (step S607). The normal statistic calculating function 304 inputs the normal statistic 308 to the variation amount calculating function 306. The deterioration statistic calculating function 305 inputs the deterioration statistic 309 to the variation amount calculating function 306. The variation amount calculating function 306 calculates the variation amount 111 by comparing the normal statistic 308 and the deterioration statistic 309.

In the embodiment, the statistic (normal statistic 308, deterioration statistic 309) of the characteristic value 307 of the transmission voice signal 109 shall be average, dispersion, number of sample, standard error of the average, standard variation, and 95% reliable interval.
The variation amount calculating function 306 compares the normal statistic 308 and deterioration statistic 309, and judges whether or not there is a difference between the normal statistic 308 and deterioration statistic 309. when the variation amount calculating function 306 judges that the 95% reliable intervals of the normal statistic 308 and deterioration statistic 309 are matched to each other, the variation amount calculating function 306 judges that there is statistically no significant difference, regards the variation amount 111 as "0", and outputs the transmission voice signal 109. When the variation amount calculating function 306 judges that the 95% reliable intervals of the normal statistic 308 and deterioration statistic 309 are not matched to each other, the variation amount calculating function 306 judges that the characteristic amount 307 of the transmission voice signal 109 is varied due to the deterioration of the reception voice signal 110, and outputs the difference between the average value of the characteristic amount 307 when the reception voice signal 110 is deteriorated and the average value of characteristic amount 307 when the reception voice signal 110 is not deteriorated (normal time) as the variation amount 111 (step S608). Note that a 99% reliable interval of the average or the like may be used in stead of the 95% reliable interval of the average. The 95% reliable interval is calculated by formula (1). SE, m included in formula (1) that shows the 95% reliable interval are respectively calculated by formula (2), (3), and (4).

Formula 1

$$95\% \text{ reliable interval} = m \pm k \times SE \quad (1)$$

Formula 2

$$SE = \frac{SD}{\sqrt{n}} \quad (2)$$

Formula 3

$$SD = \sqrt{\frac{\sum (x_i - m)^2}{n - 1}} \quad (3)$$

Formula 4

$$m = \frac{\sum x_t}{n} \quad (4)$$

m is the average value, k is a constant number that is determined by the number of sample (1.96 when the number of sample is ∞) SE is the standard error of the average, SD is the standard variation, and n is the number of sample.

4. Characteristic Amount 307

Next, the characteristic amount 307 calculated by the characteristic amount calculating function 302 will be described in detail. The characteristic amount 307 according to the embodiment is constituted by the power, power dynamic range, power spectrum inclination, speaking speed, pause length, pitch frequency, pitch frequency dynamic range, and vocal length of the transmission voice signal 109 which are described below.

4.1 Power of Transmission Voice Signal 109

The power of the transmission voice signal 109 of the characteristic amount 307 will be described.
The characteristic amount calculating function 302 calculates the power of the transmission voice signal 109 by formula (5).

Formula 5

$$p = 10 * \log 10 \left( \frac{\sum_{i=0}^{N-1} x_i^2}{N} \right) \quad (5)$$

p is frame electric power (dB), N is the number of sample of a frame, and xi is the amplitude of ith sample.

4.2. Power Dynamic Range of Transmission Voice Signal 109

The power dynamic range of the transmission voice signal 109 of the characteristic value 307 will be described.
The characteristic amount calculating function 302 calculates the power dynamic range (p_range) of the transmission voice signal 109 by formula (6).

Formula 6

$$p\_range = \max(pt-k) - \min(pt-k) K=0, \ldots, M-1 \quad (6)$$

pj is jth frame power (dB). t is the present frame, M is the number of frame in an observation interval of the dynamic range. max( ) is a function that outputs the maximum value in the interval, min( ) is a function that outputs the minimum value in the interval.

4.3. Power Spectrum Inclination of Transmission Voice Signal 109

The power spectrum inclination of the transmission voice signal 109 of the characteristic amount 307 will be described.
(1) The characteristic amount calculating function 302 calculates a power spectrum by performing a time frequency conversion on the transmission voice signal 109 from which the ambient noise 108 is removed. The time frequency conversion is a method of such as Fourier transform or the like.
(2) The characteristic amount calculating function 302 calculates the inclination of the power spectrum.
The characteristic amount calculating function 302 expresses the power spectrum for every frequency by (xi, yi) and calculates the power spectrum inclination as a real inclination when a least square method is applied to a linear function.
xi is the frequency (HZ) of ith power spectrum, and yi is the magnitude (dB) of ith power spectrum.

4.4. Speaking Speed of Transmission Voice Signal 109

The speaking speed of the transmission voice signal 109 of the characteristic amount 307 will be described.

The characteristic amount calculating function 302 detects a vocal of the input voice, counts the number of the vocal in a predetermined time, and calculates the speaking speed by the number of the vocal.

4.5. Pause Length of Transmission Voice Signal 109.

The pause length of the transmission voice signal 109 of the characteristic amount 307 will be described.

(1) The characteristic amount calculating function 302 performs a sound detection processing of the transmission voice signal 109 from which the ambient noise 108 is removed. The characteristic amount calculating function 302 detects the frame power by comparing with a threshold value. The threshold value is a long-term average of the frame power.

(2) The characteristic amount calculating function 302 calculates a continuous length of a no-sound interval as the pause length.

4.6. Pitch Frequency of Transmission Voice Signal 109

The pitch frequency of the transmission voice signal 109 of the characteristic amount 307 will be described.

The characteristic amount calculating function 302 calculates the pitch frequency by formula (8). Further, the characteristic amount calculating function 302 calculates a correlation coefficient when a shifted position is "a" by formula (7).

Formula 7

$$corr(a) = \frac{\sum_{i=0}^{M-1} x(i-a)x(i)}{\sqrt{\sum_{i=0}^{M-1} x(i-a)^2} \sqrt{\sum_{i=0}^{M-1} x(i)^2}} \quad (7)$$

Formula 8

$$pitch = freq/a\_max \quad (8)$$

X is an input signal, M is a length (sample) of an interval in which the correlation coefficient is calculated, a is a starting position of a signal that calculates the correlation coefficient, pitch is the pitch frequency (Hz), corr(a) is the correlation coefficient in the case where the shifted position is "a", a_max is "a" corresponding to maximum correlation coefficient, i is an index (sample) of the signal, and freq is a sampling frequency (Hz).

4.7. Pitch Frequency Dynamic Range of Transmission Voice Signal 109

The pitch frequency dynamic range of the transmission voice signal 109 of the characteristic amount 307 will be described.

The characteristic amount calculating function 302 calculates the pitch frequency dynamic range by formula (9).

Formula 9

$$p\_range = \max(pt-k) - \min(pt-k) \; k=0,\ldots,M-1 \quad (9)$$

p_range is the pitch frequency dynamic range (Hz), pj is jth pitch frequency (Hz). t is the present frame, M is the number of frame of an observation interval of the dynamic range, max( ) is a function for outputting the maximum value in the interval, and min( ) is a function for outputting the minimum value in the interval.

4.8. Vocal Length of Transmission Voice Signal 109

The vocal length of the transmission voice signal 109 of the characteristic value 307 will be described.

The characteristic amount calculating function 302 calculates the vocal length of the transmission voice signal 109. A vocal detection processing of an input (transmission sound from which ambient noise is removed) is performed.

(1) The characteristic amount calculating function 302 calculates a pitch correlation (corr(a_max)), compares with a predetermined threshold value, and judges the present frame as a vocal when larger than the threshold value.

(2) The characteristic amount calculation function 302 calculates the length of the vocal (frame) as a continuous length of a vocal interval.

5. Speech Control Effect Applying Function 102

Figure 7A:
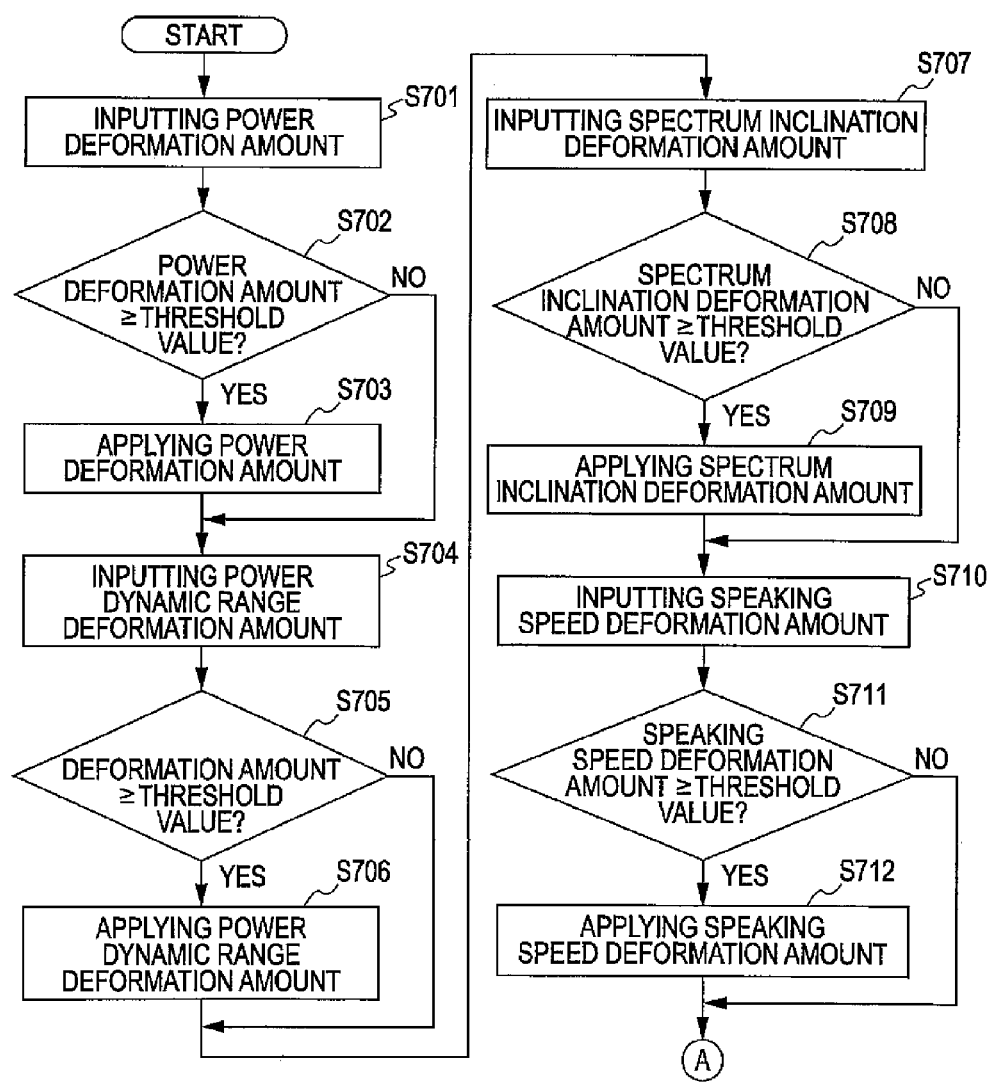
FIGS. 7A and 7B are a flowchart that is processed by a speech control effect applying function according to the embodiment.
Figure 7B:
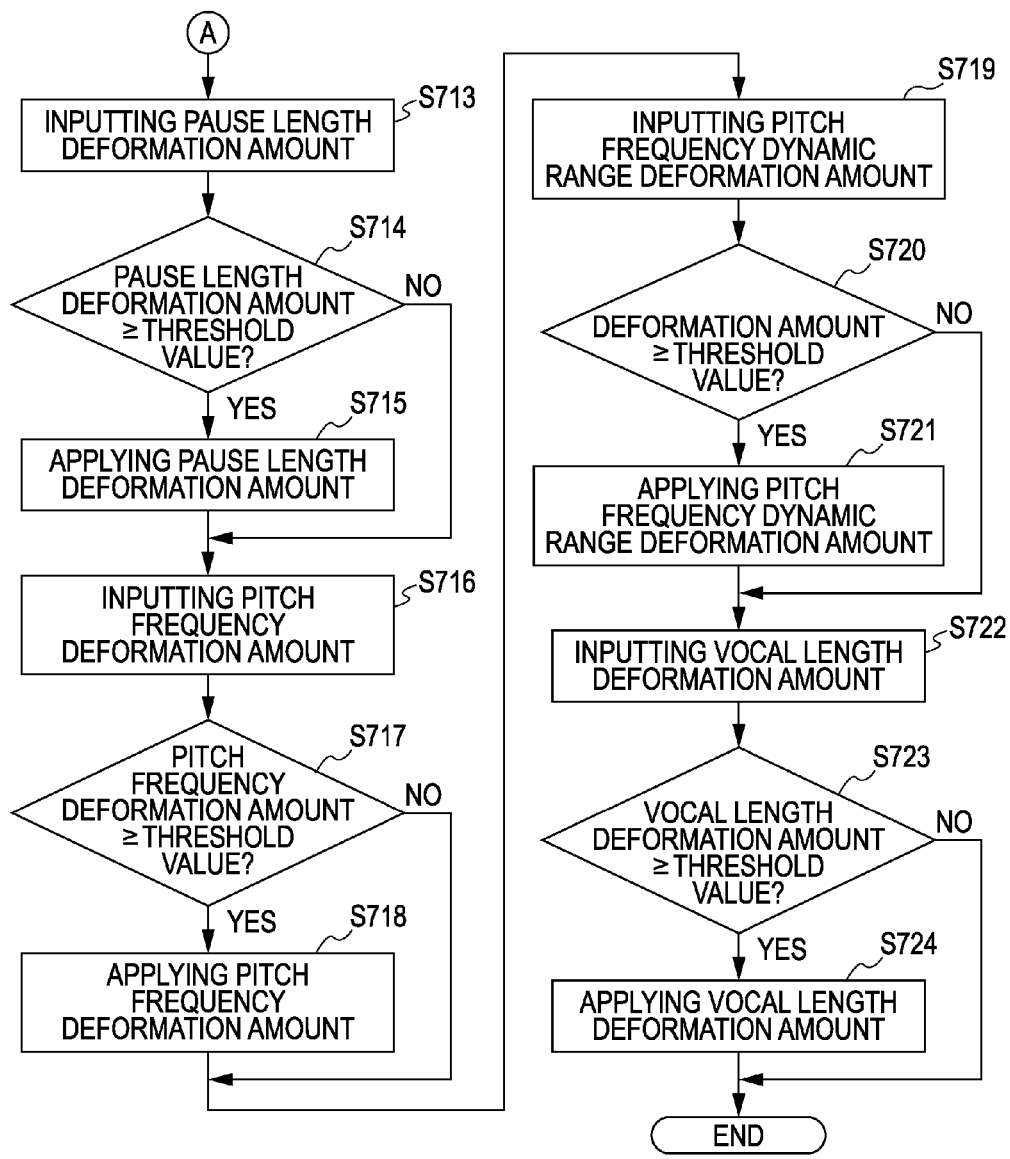

Next, a processing of the speech control effect applying function 102 will be described. FIGS. 7A and 7B are a flowchart of a processing performed by the speech control effect applying function 102 according to the embodiment. As shown in FIGS. 7A and 7B, in the embodiment, the variation amount 111 applied to the reception voice signal 110 by the speech control effect applying function 102 is constituted by a power deformation amount 71, power dynamic range 72, spectrum inclination 73, speaking speed deformation amount 74, pause length 75, pitch frequency deformation amount 76, pitch frequency dynamic range 77, and vocal length deformation amount 78.

The speech control effect applying function 102 applies the deformation amounts 71 to 78 constituting the variation amount 111 to the reception voice signal 110 in accordance with the processing flow shown in FIGS. 7A and 7B.

The speech control effect calculating function 101 inputs the variation amount 111 to the speech control effect applying function 102. In the embodiment, the speech control effect calculating function 101 inputs the deformation amounts 71 to 77 constituting the variation amount 111 to the speech control effect applying function 102 in series.

The speech control effect applying function 102 receives the power deformation amount 71 (step S701).

The speech control effect applying function 102 judges whether or not the power deformation amount 71 is not less than a threshold value (step S702). The threshold value 79 shall be predetermined. When the speech control effect applying function 102 judges that the power deformation amount 71 is not less than the threshold value 79 (YES in step S702), the speech control effect applying function 102 applies the power deformation amount 71 to the reception voice signal 110. (step S703). When the speech control effect applying function 102 judges that the power deformation amount 71 is less than the threshold value 79 (No in step S702), the speech control effect applying function 102 receives the power dynamic range deformation amount 72 (step S704).

The speech control effect applying function 102 judges whether or not the power dynamic range deformation amount 72 is not less than a threshold value 80 (step S705). The threshold value 80 shall be predetermined. When the speech control effect applying function 102 judges that the power dynamic range deformation amount 72 is not less than the threshold value 80 (YES in step S705), the speech control effect applying function 102 applies the power dynamic range deformation amount 72 to the reception voice signal 110 (step S706). When the speech control effect applying function 102 judges that the power dynamic range deformation amount 72 is less than the threshold value 80 (No in step S705), the speech control effect applying function 102 receives the spectrum inclination deformation amount 73 (step S707).

The speech control effect applying function 102 judges whether or not the spectrum inclination deformation amount 73 is not less than a threshold value 81 (step S708). The threshold value 81 shall be predetermined. When the speech control effect applying function 102 judges that the spectrum inclination deformation amount 73 is not less than the threshold value 81 (YES in step S708), the speech control effect applying function 102 applies the spectrum inclination deformation amount 73 to the reception voice signal 110 (step S709). When the speech control effect applying function 102 judges that the spectrum inclination deformation amount 73 is less than the threshold value 81 (No in step S708), the speech control effect applying function 102 receives the speaking speed deformation amount 74 (step S710). The speech control effect applying function 102 judges whether or not the speaking speed deformation amount 74 is not less than a threshold value 82 (step S711). The threshold value 82 shall be predetermined. When the speech control effect applying function 102 judges that the speaking speed deformation amount 74 is not less than the threshold value 82 (YES in step S711), the speech control effect applying function 102 applies the speaking speed deformation amount 74 to the reception voice signal 110 (step S712). When the speech control effect applying function 102 judges that the speaking speed deformation amount 74 is less than the threshold value 82 (No in step S711), the speech control effect applying function 102 receives the pause length deformation amount 75 (step S713).

The speech control effect applying function 102 judges whether or not the pause length deformation amount 75 is not less than a threshold value 83 (step S714). The threshold value 83 shall be predetermined. When the speech control effect applying function 102 judges that the pause length deformation amount 75 is not less than the threshold value 83 (YES in step S714), the speech control effect applying function 102 applies the pause length deformation amount 75 to the reception voice signal 110 (step S715). When the speech control effect applying function 102 judges that the pause length deformation amount 75 is less than the threshold value 83 (No in step S714), the speech control effect applying function 102 receives the pitch frequency deformation amount 76 (step S716).

The speech control effect applying function 102 judges whether or not the pitch frequency deformation amount 76 is not less than a threshold value 84 (step S717). The threshold value 84 shall be predetermined. When the speech control effect applying function 102 judges that the pitch frequency deformation amount 76 is not less than the threshold value 84 (YES in step S717), the speech control effect applying function 102 applies the pitch frequency deformation amount 76 to the reception voice signal 110 (step S718). When the speech control effect applying function 102 judges that the pitch frequency deformation amount 76 is less than the threshold value 84 (No in step S717), the speech control effect applying function 102 receives the pitch frequency dynamic range deformation amount 77 (step S719).

The speech control effect applying function 102 judges whether or not the pitch frequency dynamic range deformation amount 77 is not less than a threshold value 85 (step S720). The threshold value 85 shall be predetermined. When the speech control effect applying function 102 judges that the pitch frequency dynamic range deformation amount 77 is not less than the threshold value 85 (YES in step S720), the speech control effect applying function 102 applies the pitch frequency dynamic range deformation amount 77 to the reception voice signal 110 (step S721). When the speech control effect applying function 102 judges that the pitch frequency dynamic range deformation amount 77 is less than the threshold value 85 (No in step S720), the speech control effect applying function 102 receives the vocal length deformation amount 78 (step S722).

The speech control effect applying function 102 judges whether or not the vocal length deformation amount 78 is not less than a threshold value 86 (step S723). The threshold value 86 shall be predetermined. When the speech control effect applying function 102 judges that the vocal length deformation amount 78 is not less than the threshold value 86 (YES in step S723), the speech control effect applying function 102 applies the vocal length deformation amount 78 to the reception voice signal 110 (step S724), and finishes the processing. When the speech control effect applying function 102 judges that the vocal length deformation amount 78 is less than the threshold value 86 (No in step S723), the speech control effect applying function 102 finishes the processing.

6. Embodiment of Speech Control Effect Applying Function 102

Next, a concrete application of each deformation amount 71 to 78 to the reception voice signal 110 performed by the speech control effect applying function 102 will be described.

First, an application processing of the power deformation amount 71 performed by the speech control effect applying function 102 will be described.

(1) The speech control effect applying function 102 calculates the power of the reception voice signal 110. In the embodiment, the speech control effect applying function 102 calculates by a dB value.

(2) The speech control effect applying function 102 adds the power deformation amount 71 to the power of the reception voice signal 110. The speech control effect applying function 102 increases/decreases the power of the reception voice signal 110 by the deformation amount 71 of the transmission voice signal 109. The speech control effect applying function 102 may multiply the deformation amount 71 by a predetermined coefficient value to increase/decrease the power of the reception voice signal 110 at a predetermined rate.

Specifically, the speech control effect applying function 102 performs calculation by using formula (10) for amplitude pr' of the reception voice signal 110.

Formula 10

$$Pr'=pr+\Delta p \qquad (10)$$

Pr' is the power (dB) of the reception voice signal 110 to which the deformation amount 71 is applied, pr is the power (dB) of the reception voice signal 110, and $\Delta p$ is the power deformation amount 71 (dB).

The speech control effect applying function 102 adjusts the reception voice signal 110 by adding the deformation amount 71 to the reception voice signal 110.

Next, an application processing of the power dynamic range deformation amount 72 performed by the speech control effect applying function 102 will be described.

(1) The speech control effect applying function 102 calculates a power dynamic range pr_range of the reception voice signal 110 by using formula (11).

Formula 11

$$pr\_range = \max(pr t-k) - \min(pr t-k) k=0,\ldots,M-1 \qquad (11)$$

pr_range is a power dynamic range, prj is a jth frame power of the reception voice signal 110, t is the present frame, M is the number of frames in an observation interval of the dynamic range, max( ) is a function for outputting the maximum value in the interval, and min( ) is a function for outputting the minimum value in the interval.

Figure 8:
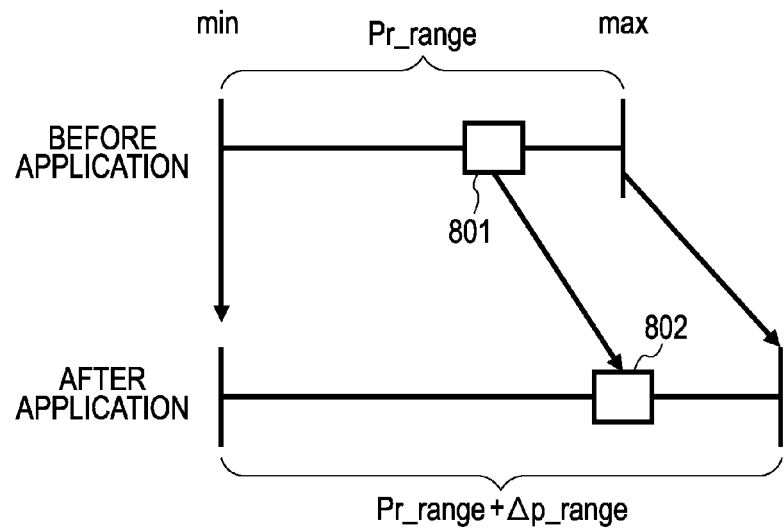
FIG. 8 is a diagram schematically showing an application processing of a power dynamic range variation amount according to the embodiment.

(2) The speech control effect applying function 102 applies the power dynamic range deformation amount 72 to the power dynamic range of the reception voice signal 110. FIG. 8 is a diagram schematically showing the application processing of the power dynamic range deformation amount 72. The power dynamic range is the one obtained by reducing the power minimum value from the power maximum value in a predetermined observation interval. The power dynamic range shows an intonation of the sound shown by the power. FIG. 8 shows the magnitude of the power of the present frame in the power dynamic range.

The speech control effect applying function 102 applies the power dynamic range deformation amount 72 to the power of the present frame of the reception voice signal 110 by using formula (12) to calculate the power pr' (dB) of the reception voice signal 110.

Formula 12

$$pr' = \min + (pr - \min) \times (pr\_range + \Delta p\_range)/pr\_range \qquad (12)$$

pr' is the power (dB) of the reception voice signal 110 after applying the deformation amount 72, min is the minimum power (dB) of the reception voice signal 110, pr is the power (dB) of the reception voice signal 110, $\Delta p$ is the power deformation amount 72 (dB). As shown in FIG. 8, the speech control effect applying function 102 performs an adjustment so that a magnitude 801 of the present frame before applying the power dynamic range deformation amount 72 and a magnitude 802 of the present frame after applying the power dynamic range deformation amount 72 become relatively the same by using Formula (12). That is, the speech control effect applying function 102 performs adjustment so that the position of the magnitude 801 of the present frame in the power dynamic range before applying the deformation amount 72 and the position of magnitude 802 of the present frame in the power dynamic range after applying the deformation amount 72 become relatively the same.

Figure 9:
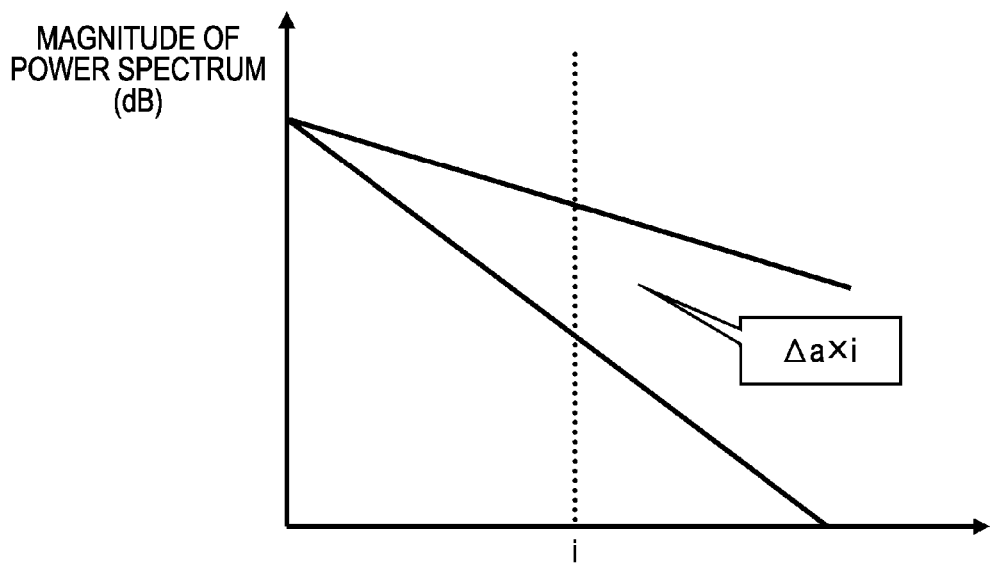
FIG. 9 is a diagram schematically showing an application processing of a spectrum inclination variation amount according to the embodiment.

Next, an application processing of the spectrum inclination deformation amount 73 performed by the speech control effect applying function 102 will be described. FIG. 9 is a diagram schematically showing an application processing of the spectrum inclination deformation amount 73. The spectrum inclination is an inclination with respect to the time frequency of the power spectrum. Generally, it becomes easy to hear for a human being as the power of high time frequency becomes larger. Accordingly, the speech control effect applying function 102 can perform adjustment so that it becomes easy to hear the reception voice signal 110 by increasing the power of high time frequency by adjusting the spectrum inclination.

(1) The speech control effect applying function 102 calculates the power spectrum of the reception voice signal 110. The power spectrum is a frequency component of each of the power. The speech control effect applying function 102 performs a time frequency conversion on the power spectrum of the reception voice signal 110.

(2) The speech control effect applying function 102 calculates the power spectrum inclination of the reception voice signal 110.

(3) The speech control effect applying function 102 corrects the power spectrum pri' of the reception voice signal 110 as shown in formula (13).

Formula 13

$$pri' = pri + \Delta a \cdot xi \qquad (13)$$

pri' is the ith band power spectrum after applying the power spectrum inclination deformation amount 73, $\Delta a$ is the power spectrum inclination deformation amount 73 (dB), and i is an index of the power spectrum band.

(4) The speech control effect applying function 102 performs a frequency time conversion on the power spectrum of the reception voice signal 110 that is calculated and corrected by formula (13).

Next, an application processing of the speaking speed deformation amount 74 performed by the speech control effect applying function 102 will be described.

(1) The speech control effect applying function 102 calculates the speaking speed of the received vice signal 110. For example, the speaking speed is calculated as described below. The speech control effect applying function 102 detects a vocal in the reception voice signal 110. The communication terminal 1200, for example, stores standard patterns of vocals and consonants in a memory (not shown in FIG. 12). Then, the speech control effect applying function 102 compares a detected sound and the standard patterns stored in the memory. The speech control effect applying function 102 judges whether the detected sound is a vocal or not by selecting a sound having a Euclidean distance that is the shortest to the detected sound among the standard patterns, thereby detecting vocal. The speech control effect applying function 102 replaces the number of vocal in a predetermined time interval by the number of syllables in the predetermined time interval. The speech control effect applying function 102 divides the reception voice signal 11 in the predetermined time interval by the replaced number of syllables in the predetermined time interval to calculate the speaking speed.

(2) The speech control effect applying function 102 adjusts the speaking speed (speed') of the reception voice signal 110 by using formula (14)

Formula 14

$$speed' = speed + \Delta speed \qquad (14)$$

speed is the speaking speed of the reception voice signal 110 before applying the deformation amount 74, $\Delta speed$ is the deformation amount 74 of the speaking speed (speed), speed' is the speaking speed of the reception voice signal 110 after applying the deformation amount 74. The speech control effect applying function 102 judges the periodicity of the speaking speed (speed) of the reception voice signal 110. Then, the speech control effect applying function 102 adjusts the speaking speed (speed) of the reception voice signal 110 by increasing or decreasing the reception voice signal 110 by one cycle.

Figure 10:
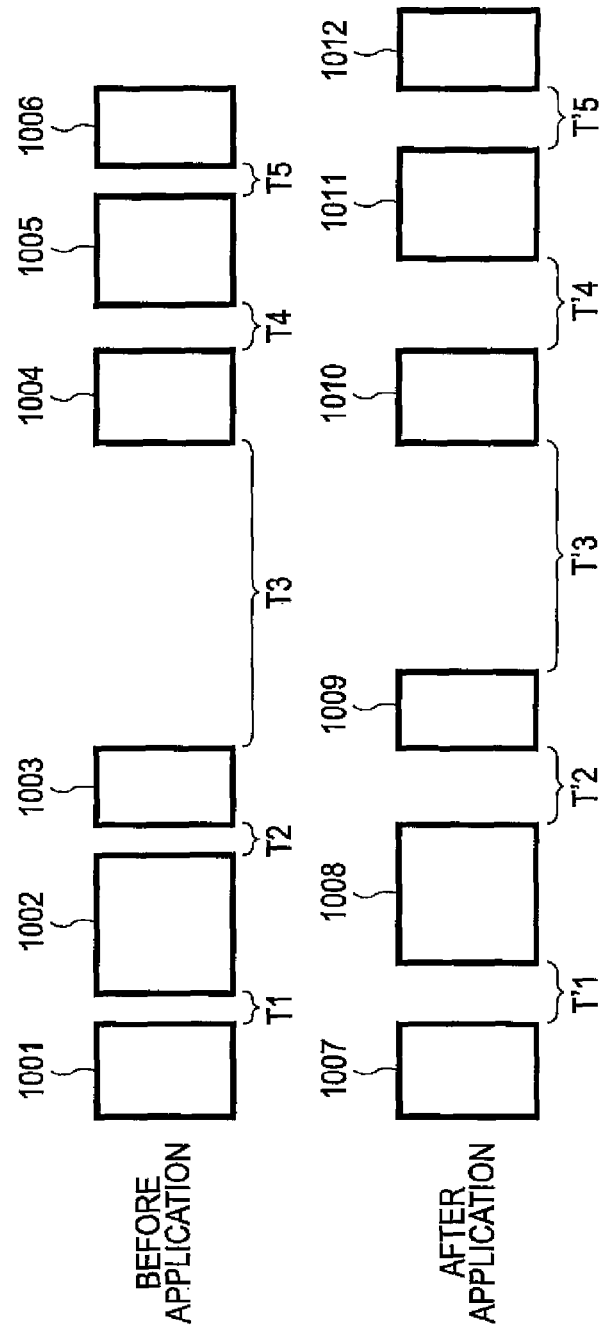
FIG. 10 is a diagram schematically showing an application processing of a pause length variation amount according to the embodiment.

Next, an application processing of the pause length deformation amount 75 performed by the speech control effect applying function 102 will be described. FIG. 10 is a diagram schematically showing the application processing of the pause length deformation amount 75.

(1) The speech control effect applying function 102 calculates pause lengths of the reception voice signal 110 (T1, T2, T3, T4, T5 described in FIG. 10). For example, the speech control effect applying function 102 compares the frame power of the reception voice signal 110 to a threshold value (for example, a long term average of the frame power). Then, the length of the interval in which the speech control effect applying function 102 judges that the frame power of the reception voice signal 110 is not more than the threshold value is calculated as the pause length. Further, the speech control effect applying function 102 may calculate an interval having no periodicity that is included in the reception voice signal 110 as a no-sound interval. The interval in which the speech control effect applying function 102 judges that the frame power of the reception voice signal 110 is larger than the threshold value is voice presence intervals 101 to 1012 of the reception voice signal 110 described in FIG. 10. Each of the voice presence intervals 1007 to 1012 is the voice presence interval corresponding to the corresponding one of the voice presence intervals 1001 to 1006.

(2) The pause length of the reception voice signal 110 is calculated by using formula (15).

Formula 15

$$\text{pause'} = \text{pause} + \Delta\text{pause} \tag{15}$$

pause is the pause length of the reception voice signal 110 before applying the deformation amount 75, Δpause is the pause length deformation amount 75, pause' is the pause length of the reception voice signal 110 after applying the deformation amount 75.

The speech control effect applying function 102 adds Δpause 75 to adjust the pause length after a pause of the reception voice signal 110 is finished. Pause lengths adjusted by the speech control effect applying function 102 are T'1, T'2, T'3, T'4, T'5 described in FIG. 10. The speech control effect applying function 102 applies the deformation amount 75 to the pause lengths T1, T2, T3, T4, T5 to calculates the pause lengths T'1, T'2, T'3, T'4, T'5. Note that the speech control effect applying function 102 performs adjustment so that no-sound interval does not become longer than a fixed length. This is to prevent that the delay time from the original reception signal 110 becomes long when the no-sound interval becomes long to seriously increase the delay by adjusting the pause length by the speech control effect applying function 102. The speech control effect applying function 102 judges that whether the no-sound interval becomes not less than a fixed length or not, and contracts the no-sound interval to eliminate time delay when it is judged that the no-sound interval is not less than the fixed length. For example, the pause length T3 described in FIG. 10 is the pause length (no-sound interval) that is judged to be not less than the fixed length by the speech control effect applying function 102. The speech control effect applying function 102 shortens the pause length T3 to the pause length T'3.

Next, an application processing of the pitch frequency deformation amount 76 performed by the speech control effect applying function 102 will be described.

(1) The speech control effect applying function 102 calculates the pitch frequency of the reception voice signal 110. The pitch frequency is a physical value showing an intonation of sound. The speech control effect applying function 102 performs calculation by formulas (7) and (8). That is, the frequency at which a correlation coefficient shown by formula (7) becomes the maximum is the pitch frequency.

(2) The speech control effect applying function 102 calculates the pitch frequency pitch' of the reception voice signal 110 by using formula (16).

Formula 16

$$\text{pitch'} = \text{pitch} + \Delta\text{pitch} \tag{16}$$

pitch is the pitch frequency of the reception voice signal 110 before applying the deformation amount 76, Δpitch is the pitch frequency deformation amount 76, and pitch' is the pitch frequency of the reception voice signal 110 after applying the pitch frequency deformation amount 76. The pitch frequency is adjusted by adding the pitch frequency of the reception voice signal 110 to the pitch frequency deformation amount 76. The sound of the reception voice signal 110 becomes higher as the pitch becomes higher.

Figure 11:
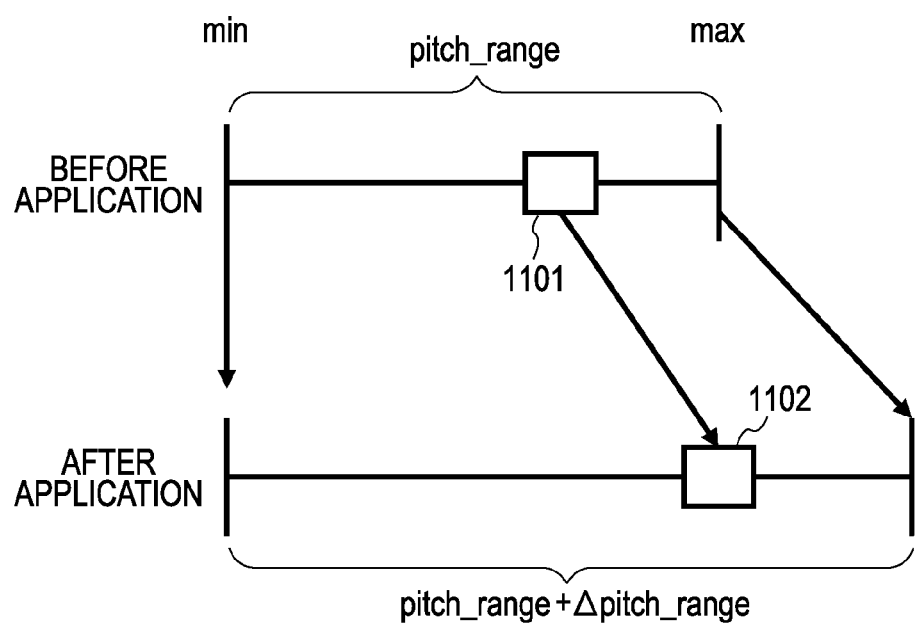
FIG. 11 is a diagram schematically showing an application processing of a pitch frequency dynamic range variation amount according to the embodiment.

Next, an application processing of the deformation amount 77 of a pitch frequency dynamic range pitch_r_range performed by the speech control effect applying function 102 will be described. FIG. 11 is a diagram schematically showing the application processing of the pitch frequency dynamic range deformation amount 77.

(1) The pitch frequency dynamic range of the reception voice signal 110 is calculated by using formula (17)

Formula 17

$$\text{pitch}\_r\_\text{range} = \max(\text{pitch}\_rt-k) - \min(\text{pitch}\_rt-k)$$
$$k=0,\ldots,M-1 \tag{17}$$

pitch_r_range is the pitch frequency dynamic range of the reception voice signal 110, pitch_rj is the pitch frequency of jth frame of the reception voice signal 110, t is the present frame, M is the number of frames in an observation interval of the dynamic range, max( ) is a function for outputting the maximum value in the interval, and min( ) is a function for outputting the minimum value in the interval.

(2) The speech control effect applying function 102 corrects the pitch frequency dynamic range of the reception voice signal 110 by the pitch frequency dynamic range deformation amount 77.

The speech control effect applying function 102 applies the pitch frequency dynamic range deformation amount 77 to the pitch frequency of the present frame of the reception voice signal 110. The speech control effect applying function 102 performs calculation so that the pitch frequency of the reception voice signal 110 becomes pitch_r' by using formula (18).

Formula 18

$$\text{pitch}\_r' = \text{pitch}\_\min + \\ (\text{pitch}\_r - \text{pitch}\_\min) \times (\text{pitch}\_\text{range} + \Delta\text{pitch}\_\text{range})/\text{pitch}\_\text{range} \tag{18}$$

pitch_r' is the pitch frequency (Hz) of the reception voice signal 110 after application, pitch_min is the minimum pitch frequency (Hz) of the reception voice signal 110, pitch_r is the pitch frequency (Hz) of the reception voice signal 110, Δpitch_range is the pitch frequency dynamic range deformation amount 77 (Hz). As shown in FIG. 11, the speech control effect applying function 102 performs an adjustment so that a pitch frequency 1101 of the present frame before applying the modulation amount 77 to the pitch frequency dynamic range and a pitch frequency 1102 of the present frame after applying the deformation amount 77 to the pitch frequency dynamic range become relatively the same by formula (18). That is, the speech control effect applying function 102 performs an adjustment so that the position of the pitch frequency 1101 of the present frame in the pitch frequency dynamic range before applying the deformation amount 77 and the position of the pitch frequency 1102 of the present frame in the pitch frequency dynamic range after applying the deformation amount 77 become relatively the same.

Next, an application processing of the vocal deformation amount 78 performed by the speech control effect applying function 102 will be described.

(1) The speech control effect applying function 102 calculates the vocal length of the reception voice signal 110.

(2) The speech control effect applying function 102 adds the vocal length deformation amount 78 to the vocal length of the reception voice signal 110. The speech control effect applying function 102 calculates vocal length vl' of the reception voice signal 110 by using formula (19).

Formula 19

$$vl' = vl + \Delta vl \quad (19)$$

vl is the vocal length (frame) of the reception voice signal 110 before application, vl' is the vocal length (frame) of the reception voice signal 110 after application, and Δvl is the variation amount (frame) of the vocal length.

The speech control effect applying function 102 performs converts the vocal length so that the speaking speed becomes vl'/vl times in the interval that is judged as a vocal interval.

Second Embodiment

7. Outline of Voice Transmission System 200

Figure 2:
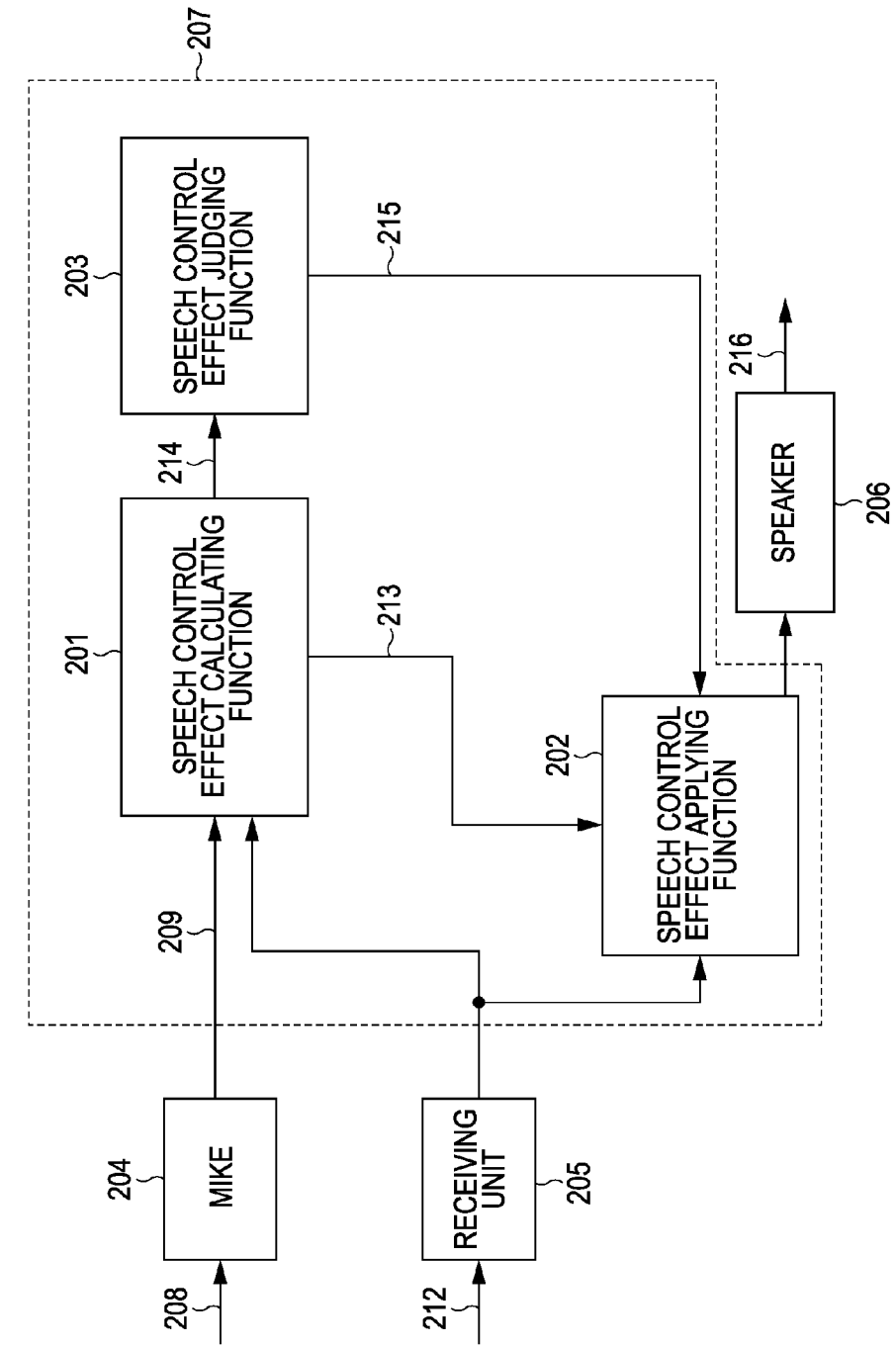
FIG. 2 is a block diagram showing an outline of a second voice transmission system according to the embodiment.

Next, another embodiment that adjusts a voice output that reflects the speech control effect will be described. FIG. 2 is a block diagram showing an outline of a voice transmission system 200 according to the embodiment.

The voice transmission system 200 is equipped with a speech control effect calculating function 201, a speech control effect applying function 202, a speech control effect judging function 203, a microphone (MIKE) 204, a receiving unit 205, and a speaker 206. The voice transmission system is also a processing system that can be provided by a communication terminal corresponding to the communication terminal 1200. A voice processing unit 207 corresponding to the voice processing unit 1211 is a unit that provides a processing of the speech control effect calculating function 201, the speech control effect applying function 202, and the speech control effect judging function 203.

The speech control effect calculating function 201 and the speech control effect applying function 202 have the same structure as the speech control effect calculating function 101 and the speech control effect applying function 102 in the first embodiment.

The voice transmission system 200 according to the embodiment has the speech control effect judging function 203, which is the different point from the voice transmission system 100. Accordingly, the speech control effect judging function 203 will be mainly described below.

The speech control effect calculating function 201 calculates the variation amount of the transmission voice that is varied due to the speech control effect, and the speech control effect applying function 202 applies the variation amount to adjust a reception voice signal 212.

Further, in the voice transmission system 200 according to the embodiment, the speech control effect judging function 203 judges whether or not the present transmission voice is varied due to the speech control effect. When the speech control effect judging function 203 judges that a present transmission voice signal 211 is varied due to the speech control effect, the speech control effect applying function 202 applies a variation mount 213 of the characteristic amount of the reception voice signal 212 that is varied due to the speech control effect to the reception voice signal 212 for adjustment. That is, in the voice transmission system 200 according to the embodiment, the presence or absence of the speech control effect is judged and the reception voice is adjusted when there is the speech control effect.

8. Processing Flowchart of Voice Transmission System 200

Figure 5:
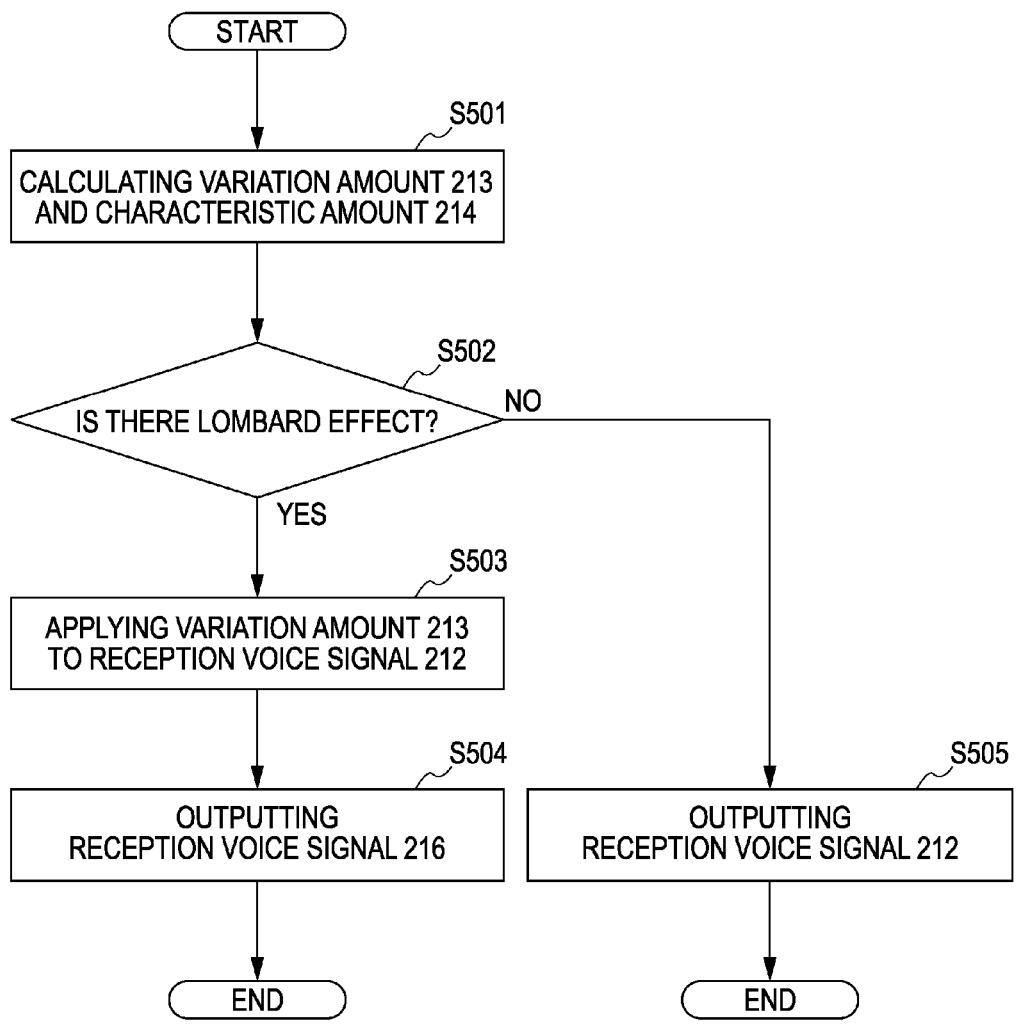
FIG. 5 is a flowchart showing a processing performed by the second voice transmission system according to the embodiment.

FIG. 5 is a processing flow performed by the voice transmission system 200. The processing that is performed by the voice transmission system 200 will be described in detail by using FIG. 5.

The microphone 204 receives a sound 208 and the receiving unit 205 receives the reception voice signal 212 from outside of the voice transmission system 200. A sound signal 209 and the reception voice signal 212 are input to the speech control effect calculating function 201. The speech control effect calculating function 201 calculates an amount (varied amount) 213 of the transmission voice signal 211 that is varied by the speech control effect and a characteristic amount 214 of the transmission voice signal 211 which is the present frame of the transmission voice signal 111 and from which an ambient noise 210 is removed by using the signals (step S501). Note that the sound signal 209 is an electrical signal corresponding to the sound 208 input to the microphone 204.

The speech control effect judging function 203 receives the characteristic amount 214 of the transmission voice signal 211 contained in the sound signal 209 of the present frame from the speech control effect calculating function 201. Then, the speech control effect judging function 203 judges whether or not the transmission voice signal 211 of the present (present frame) is varied due to the speech control effect (step S502). When the speech control effect judging function 203 judges that the transmission voice signal 211 is varied due to the speech control effect (YES in step S502), the speech control effect applying function 202 applies the variation amount 213 of the characteristic amount of the reception voice signal 212 that is varied by the speech control effect to the reception voice signal 212 (step S503). The speech control effect applying function 202 outputs a reception voice signal 216 to which the variation amount 213 is applied (step S504). When the speech control effect judging function 203 judges that the transmission voice signal 211 is not varied by the speech control effect (No in step S502), the speech control effect applying function 202 outputs the reception voice signal 212 (step S505). In step S502, the judgment of whether or not the transmission voice signal 211 is varied due to the speech control effect is judged from the characteristic amount 214 output from the speech control effect calculating function 201. The speech control effect judging function 203 calculates a judgment result 215 of whether the characteristic amount 214 of the transmission voice signal 211 of the present frame is varied by the speech control effect or not by a following processing.

The speech control effect judging function 203 calculates a distance S1 between the characteristic amount of the present frame of the transmission voice signal 211 and the transmission voice signal 211 when the reception voice signal 212 is not less than a predetermined ratio with respect to the ambient noise 210, and a distance S2 between the characteristic amount of the present frame of the transmission voice signal 211 and the transmission voice signal 211 when the reception voice signal 212 is not deteriorated. S1, S2 can be expressed by formulas (20), (21).

Formula 20

$$S1 = |Mn - Mc| \quad (20)$$

Formula 21

$$S2 = |Md - Mc| \quad (21)$$

Mn is an average of the transmission voice signal 211 when the reception voice signal 212 is not deteriorated, Md is an average of the transmission voice signal 211 when the reception voice signal 212 is not deteriorated, and Mc is an average of the transmission voice signal of the present frame.

When the speech control effect judging function 203 judges that S1<S2, it is judged that the transmission voice signal 211 of the present frame is varied due to the speech control effect. When the speech control effect judging function 203 judges that S1>S2, it is judged that the transmission voice signal 211 of the present frame is not varied due to absence of the speech control effect. That is, the speech control effect judging function 203 compares S1 and S2 and judges that the present frame of the transmission voice signal 211 belongs to the smaller one. Note that, when there is a plurality of the characteristic amounts in the transmission voice signal 211, S1 and S2 are calculated and compared for every characteristic amount. Further, a weight may be changed in accordance with the characteristic amount when the speech control effect judging function 203 averages the characteristic amount.

According to the voice transmission system of the embodiment, the following effect can be obtained. In the voice transmission system according to the embodiment, the variation amount of the transmission voice that is varied due to the speech control effect is calculated. The voice transmission system applies the variation amount to the reception voice signal, so that it becomes possible to emphasize the reception voice signal in accordance with auditory property of the user. Accordingly, in the voice transmission system according to the embodiment, a reception voice which is easy to hear for the user as compared with a conventional voice transmission system can be created.

All examples and conditional language recited herein are intended for pedagogical purposes to aid the reader in understanding the invention and the concepts contributed by the inventor to furthering the art, and are to be construed as being without limitation to such specifically recited examples and condition, nor does the organization of such examples in the specification relate to a showing of superiority and inferiority of the invention. Although the embodiment of the present inventions have been described in detail, it should be understood that the various changes, substitutions, and alternations could be made hereto without departing from the spirit and scope of the invention.

What is claimed is:

1. A communication apparatus for adjusting a voice signal received from another communication apparatus in accordance with an ambient noise, the communication apparatus comprising:
    a microphone for receiving the ambient noise and input voice and outputting a voice input signal corresponding to a level of the input voice and the ambient noise;
    a receiver for receiving the voice signal from the another communication apparatus;
    a processer for extracting, from the voice input signal, a voice component originated by a sender and an ambient noise component originated by the ambient noise, determining a ratio between the voice component and the ambient noise component, and adjusting an amplitude of the received voice signal in accordance with the ratio; and
    a speaker for outputting a reception voice corresponding to the adjusted reception voice signal,
    wherein the processer judges presence or absence of a difference between an average of a normal statistic and an average of a deterioration statistic, and calculates the difference in a characteristic amount characterizing the voice input signal between cases where a ratio is larger than a predetermined threshold value and smaller than the predetermined threshold value depending on the presence or absence of the difference, the normal statistic and the deterioration statistic being determined based on a normal status and a deterioration status of the received voice signal.

2. The communication apparatus according to claim 1, wherein the processer calculates a reliable interval of each of the statistics, and judges the presence or absence of the difference in the averages of the statistics of the characteristic amounts by whether the reliable intervals are overlapped.

3. The communication apparatus according to claim 2, wherein the processer calculates the difference of the statistics in the case where the reliable intervals of the statistics are not overlapped.

4. The communication apparatus according to claim 1, wherein a power spectrum inclination statistic of the transmission voice signal is calculated in the processer.

5. The communication apparatus according to claim 1, wherein the processer calculates a power dynamic range statistic of the voice input signal.

6. The communication apparatus according to claim 1, wherein the processer calculates a speaking speed of the voice input signal.

7. The communication apparatus according to claim 1, wherein the processer calculates a pause length of the voice input signal.

8. The communication terminal according to claim 1, wherein the processer calculates a pitch frequency of the voice input signal.

9. The communication apparatus according to claim 1, wherein the processer calculates a pitch frequency dynamic range of the voice input signal.

10. A method of adjusting a voice output of a communication apparatus which transmits a voice input signal and adjusts a voice signal received from another communication apparatus in accordance with an ambient noise, the method comprising the steps of:
    outputting a voice input signal corresponding to a level of a voice and the ambient noise to be input;
    receiving the voice signal from the another communication apparatus;
    extracting, from the voice input signal, a voice component originated by a sender and an ambient noise component originated by the ambient noise around the sender;
    determining a ratio between the voice component and the ambient noise component;
    adjusting the amplitude of the received voice signal in accordance with the ratio; and
    outputting a reception voice corresponding to the adjusted reception voice signal,
    wherein the adjusting includes judging a presence or absence of a difference between an average of a normal statistic and an average of a deterioration statistic, and calculating the difference in a characteristic amount characterizing the voice input signal between cases where a ratio is larger than a predetermined threshold value and smaller than the predetermined threshold value depending on the presence or absence of the difference, the normal statistic and the deterioration statistic being determined based on a normal status and a deterioration status of the received voice signal.

* * * * *